US012598702B2

(12) United States Patent
Choi

(10) Patent No.: US 12,598,702 B2
(45) Date of Patent: Apr. 7, 2026

(54) PRINTED CIRCUIT BOARD

(71) Applicant: SAMSUNG ELECTRO-MECHANICS CO., LTD., Suwon-si (KR)

(72) Inventor: Jin Young Choi, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 217 days.

(21) Appl. No.: 18/103,729

(22) Filed: Jan. 31, 2023

(65) Prior Publication Data

US 2024/0040697 A1      Feb. 1, 2024

(30) Foreign Application Priority Data

Jul. 27, 2022    (KR) ........................ 10-2022-0093165

(51) Int. Cl.
*H05K 1/11*            (2006.01)
(52) U.S. Cl.
CPC ..... *H05K 1/113* (2013.01); *H05K 2201/0355* (2013.01); *H05K 2201/09563* (2013.01)
(58) Field of Classification Search
CPC .. H05K 1/11; H05K 1/113; H05K 2201/0355; H05K 2201/09563
USPC ........................................................ 174/255
See application file for complete search history.

(56) References Cited

U.S. PATENT DOCUMENTS

| | | | |
|---|---|---|---|
| 2014/0182920 A1* | 7/2014 | Yanagisawa | H05K 3/421 174/262 |
| 2015/0027754 A1 | 1/2015 | Shimoda et al. | |
| 2020/0154568 A1 | 5/2020 | Na et al. | |
| 2023/0143137 A1* | 5/2023 | Oikawa | H03H 3/08 310/313 B |

FOREIGN PATENT DOCUMENTS

| | | |
|---|---|---|
| JP | H11-346045 A | 12/1999 |
| KR | 10-2014-0104487 A | 8/2014 |
| KR | 10-2020-0055432 A | 5/2020 |
| WO | 2021215463 A1 | 10/2021 |

OTHER PUBLICATIONS

Office Action dated Nov. 27, 2025 issued in the corresponding Korean Patent Application No. 10-2022-0093165 with the English translation.

* cited by examiner

*Primary Examiner* — Tremesha W Burns
(74) *Attorney, Agent, or Firm* — Morgan Lewis & Bockius LLP

(57) ABSTRACT

A printed circuit board includes an insulating layer having first and second surfaces opposite to each other with respect to a first direction; a via hole penetrating a region between the first and second surfaces; a first conductor layer including a first contact portion in contact with the first surface and a first non-contact portion protruding from the first contact portion and disposed on the via hole with respect to a second direction perpendicular to the first direction; and a metal layer filling the via hole.

20 Claims, 16 Drawing Sheets

<u>100G</u>

100A

FIRST
DIRECTION

SECOND
DIRECTION $$\left.\begin{array}{c}131\\132\\133\end{array}\right\}130$$

THIRD
DIRECTION

SECOND
DIRECTION

100B

FIRST
DIRECTION

SECOND
DIRECTION

131 ⎫
132 ⎬ 130
133 ⎭

THIRD
DIRECTION

SECOND
DIRECTION

100C

100F

FIRST
DIRECTION

SECOND
DIRECTION

131 ⎫
132 ⎬130
133 ⎭

THIRD
DIRECTION

SECOND
DIRECTION

100G

FIRST
DIRECTION

SECOND
DIRECTION $$\left.\begin{array}{l}131\\132\\133\end{array}\right\}130$$

THIRD
DIRECTION

SECOND
DIRECTION

PRINTED CIRCUIT BOARD

CROSS-REFERENCE TO RELATED APPLICATIONS

This application claims benefit of priority to Korean Patent Application No. 10-2022-0093165 filed on Jul. 27, 2022 in the Korean Intellectual Property Office, the disclosure of which is incorporated herein by reference in its entirety.

BACKGROUND

1. Technical Field

The present disclosure relates to a printed circuit board.

2. Description of Related Art

Recently, with the development of electronic devices, a plating technique for a printed circuit board included in electronic devices has also been continuously developed. For example, there has been continuing demand for low plating thickness and small plating tolerances, and accordingly, the ability to perform fill-plating within a via hole has become more important. When fill-plating is performed within the via hole under conditions such as a low plating thickness, dimples may occur in the via formed by the plating.

SUMMARY

An aspect of the present disclosure is to provide a printed circuit board which may improve fill-plating quality in a via hole, for example, addressing a dimple defect.

An aspect of the present disclosure is to process a via hole such that a portion of the conductor layer may extend to upper and/or lower sides of the via hole before fill-plating.

For example, according to an aspect of the present disclosure, a printed circuit board includes an insulating layer having first and second surfaces facing each other along a first direction; a via hole penetrating a region between the first and second surfaces; a first conductor layer including: a first contact portion in contact with the first surface and a first non-contact portion disposed on the via hole and protruding from the first contact portion along a second direction perpendicular to the first direction; and a metal layer filling the via hole.

For example, according to an aspect of the present disclosure, a printed circuit board includes an insulating layer; a via metal layer penetrating a region between upper and lower surfaces of the insulating layer; a first conductor layer disposed on an upper surface of the insulating layer and extending partially upwardly of the via metal layer to cover a portion of an upper side of the via metal layer; and a second conductor layer disposed on a lower surface of the insulating layer and partially extending downwardly of the via metal layer to cover a portion of a lower side of the via metal layer.

For example, according to an aspect of the present disclosure, a printed circuit board includes an insulating layer having first and second surfaces facing each other along a first direction; a via hole penetrating a region between the first and second surfaces; a first conductor layer including: a first contact portion in contact with the first surface and a first non-contact portion disposed on the via hole and protruding from the first contact portion along a second direction perpendicular to the first direction; and a second conductor layer including a second contact portion in contact with the second surface, wherein the first and second conductor layers have first and second openings on the via hole, respectively, and a width of each of the first and second openings is different from each other on a cross-section of the printed circuit board.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Electronic Device

Figure 1:
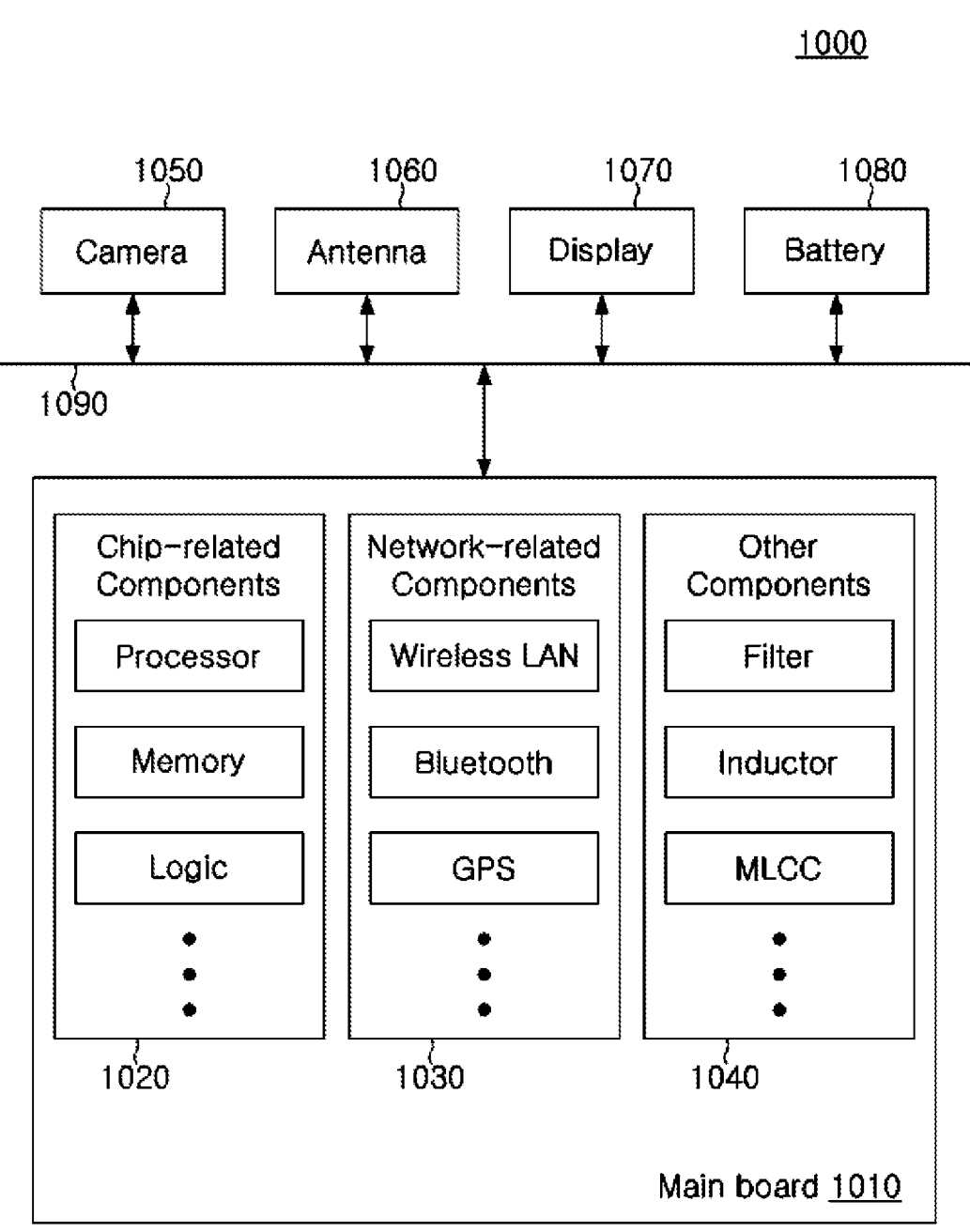
FIG. 1 is a block diagram illustrating an example embodiment of an electronic device system.

FIG. 1 is a block diagram illustrating an example embodiment of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. Also, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. Also, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. Also, other components 1040 may be combined with each other, together with the chip related components 1020 and/or the network related components 1030 described above.

Depending on a type of the electronic device 1000, the electronic device 1000 may include other components that may or may not be physically or electrically connected to the mainboard 1010. The other components may include, for example, a camera module 1050, an antenna module 1060, a display 1070, and a battery 1080. However, the other components are not limited thereto, and may include an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. The other components may also include other components used for various purposes depending on a type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
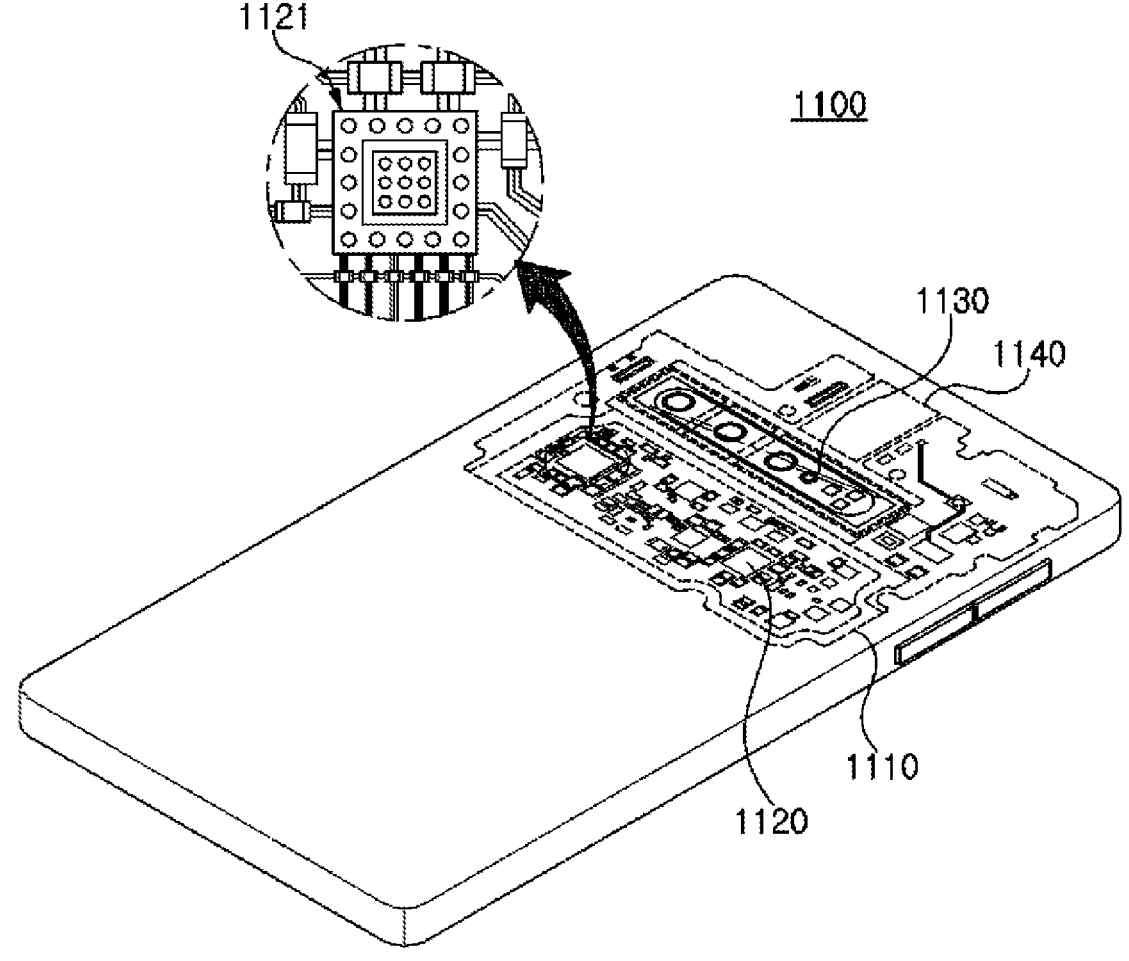
FIG. 2 is a perspective diagram illustrating an example embodiment of an electronic device.

FIG. 2 is a perspective diagram illustrating an example embodiment of an electronic device.

Referring to FIG. 2, an electronic device may be a smartphone 1100. A motherboard 1110 may be accommodated in the smartphone 1100, and various components 1120 may be physically or electrically connected to the motherboard 1110. Also, other components that may or may not be physically or electrically connected to the motherboard 1110, such as a camera module 1130, may be accommodated in the body 1101. A portion of the components 1120 may be the chip related components, such as, for example, a component package 1121, but an example embodiment thereof is not limited thereto. The component package 1121 may have the form of a printed circuit board on which electronic components including active components and/or passive components are surface-mounted. Alternatively, the component package 1121 may be configured in the form of a printed circuit board in which active components and/or passive components are buried. The electronic device is not necessarily limited to the smartphone 1100, and may be other electronic devices as described above.

Printed Circuit Board

Figure 3:
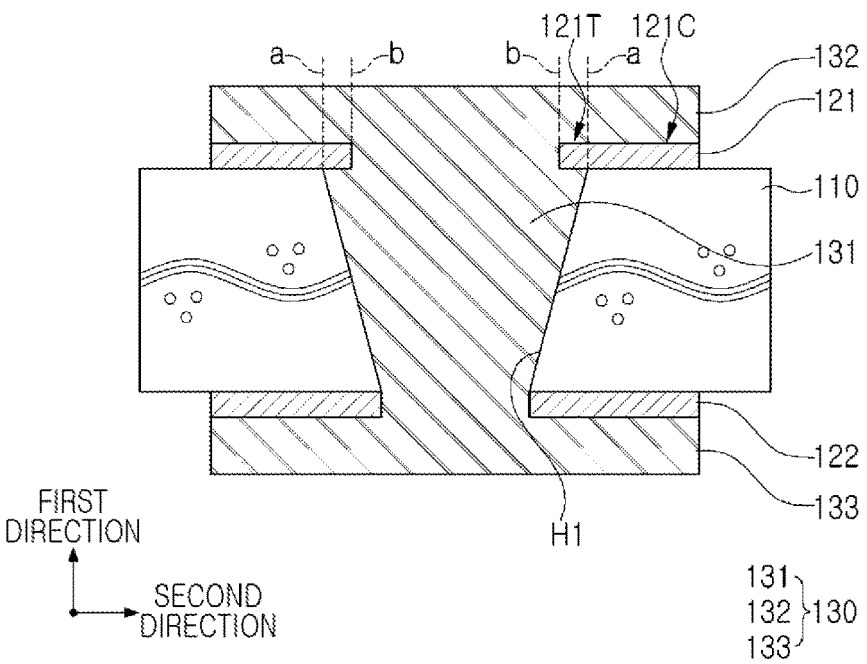
FIG. 3 is a cross-sectional diagram illustrating an example embodiment of a printed circuit board.

FIG. 3 is a cross-sectional diagram illustrating an example embodiment of a printed circuit board.

Figure 4:
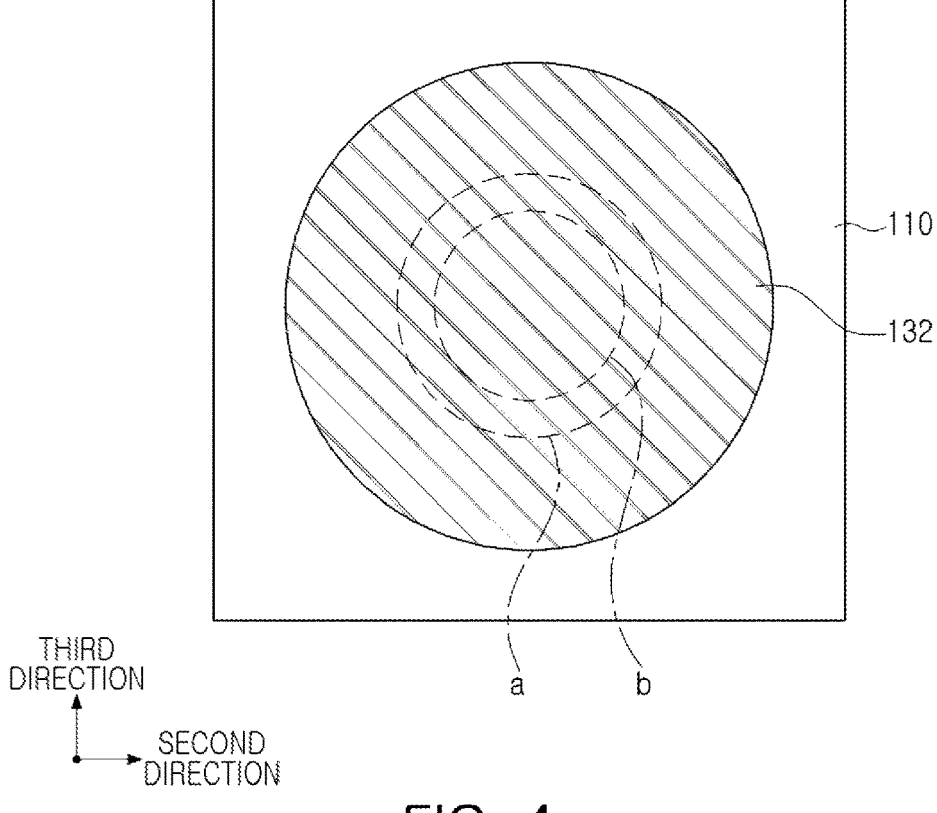
FIG. 4 is a plan diagram illustrating the printed circuit board in FIG. 3, viewed from above.

FIG. 4 is a plan diagram illustrating the printed circuit board in FIG. 3, viewed from above.

Referring to the drawings, the printed circuit board 100A according to an example may include an insulating layer 110 having a first surface and a second surface (or upper and lower surfaces) opposite to each other in a first direction (or vertical direction), a via hole H1 penetrating a region between the first and second surfaces, a first conductor layer 121 including a first contact portion 121C in contact with the first surface, and a first non-contact portion 121T protruding from the first contact portion 121C in a second direction (or horizontal direction) perpendicular to the first direction and disposed on the via hole H1, and a metal layer 130 filling the via hole H1. If desired, a second conductor layer 122 disposed on the second surface may be further included. In the drawings, "a" may be an upper edge of the via hole H1, and "b" may be an inner edge of the first conductor layer 121.

The metal layer 130 may extend to the first and second conductor layers 121 and 122. The metal layer 130 may include a via metal layer 131 filling the via hole H1, a first pad metal layer 132 disposed on the first conductor layer 121 and connected to the via metal layer 131, and a second pad metal layer 133 disposed on the second conductor layer 122 and connected to the via metal layer 132. The via metal layer 131 and the first and second pad metal layers 132 and 133 may be formed together through a plating process and may be integrated with each other without a boundary therebetween. In the drawing, dotted lines therebetween may be used to distinguish components for ease of description.

Here, filling the via hole H1 may indicate that a filled via may be formed by fill-plating, and may further include filling the via hole H1 with the metal layer 130 and also roughly filling by voids in partial areas due to limitations in the process. For example, the via metal layer 131 may be a filled via, which may be distinguished from a conformal via formed by plating a metal layer to a substantially constant thickness along the wall surface of the via hole.

In the printed circuit board 100A according to an example, a portion of the first conductor layer 121, that is, for example, the first non-contact portion 121T may protrude and extend to the via hole H1 as described above, the first non-contact portion 121T1, which is a protruding portion of the first conductor layer 121, may act as a wall during fill-plating to form the via metal layer 131, which may contribute to fill-plating acceleration. Accordingly, the plating thickness may be stably secured within the via hole (H1), and accordingly, the effect of addressing dimple defects may be expected.

Hereinafter, the components of the printed circuit board 100A according to an example will be described in greater detail with reference to the drawings.

The insulating layer 110 may include an insulating material. As an insulating material, a thermosetting resin such as an epoxy resin, a thermoplastic resin such as polyimide, or a material in which these resins are mixed with an inorganic filler such as silica, or a resin impregnated in a core material such as glass fiber (glass fiber, glass cloth, glass fabric) together with an inorganic filler, such as, for example, an Ajinomoto build-up film (ABF), prepreg, or the like, may be used, but an example embodiment thereof is not limited thereto. When the insulating layer 110 includes an insulating resin, inorganic filler, and glass fiber, it may be more difficult to stably secure the plating thickness in the fill-plating process after processing the via hole, but according to the example embodiment, the issue may be addressed as described above.

The via hole H1 may penetrate a region between the upper and lower surfaces of the insulating layer 110. On a cross-section, the via hole H1 may have a shape in which the width of the upper opening of the via hole H1 may be greater than the width of the lower opening of the via hole H1. For example, the via hole H1 may have a tapered shape. At least a portion of each of the inorganic filler and/or glass fibers included in the insulating layer 110 may protrude from a wall surface of the via hole H1.

Here, the width may be measured using a scanning microscope or an optical microscope, such as an optical microscope of Olympus (×1,000), based on the polished or cut cross-section of the printed circuit board 100A, and when the width is not constant, the size relationship may be determined based on the largest width.

Each of the conductor layers 121 and 122 may include a metal material. The metal material may include copper (Cu), aluminum (Al), silver (Ag), tin (Sn), gold (Au), nickel (Ni), lead (Pb), titanium (Ti), and/or alloys thereof. Preferably, copper (Cu) may be included. Each of the conductor layers 121 and 122 may be copper foil (Cu foil), but an example embodiment thereof is not limited thereto, and the layers may be electroless plating layers (or chemical copper).

The metal layer 130 may include a metal material. The metal material may include copper (Cu), aluminum (Al), silver (Ag), tin (Sn), gold (Au), nickel (Ni), lead (Pb), titanium (Ti), and/or alloys thereof. Preferably, copper (Cu) may be included. The metal layer 130 may include an electrolytic plating layer (or electrolytic copper), but an example embodiment thereof is not limited thereto, and the metal layer 130 may further include an electroless plating layer (or chemical copper) if desired.

The via metal layer 131 may provide an electrical connection path between the pad metal layers 132 and 133. A portion of the first conductor layer 121, that is, for example, the first non-contact portion 121T, may extend upwardly of the via metal layer 131 to cover a portion of the upper side of the via metal layer 131. The first pad metal layer 132 may be disposed on the upper surface of the first conductor layer 121 and may be connected to the upper surface of the via metal layer 131. The second pad metal layer 133 may be disposed on the lower surface of the second conductor layer 122 and may be connected to the lower side of the via metal layer 131. The pad metal layers 132 and 133 may have a thickness greater than those of the conductor layers 121 and 122, and the thickness may be measured using a scanning microscope or an optical microscope, such as an optical microscope (×1,000) of Olympus, based on the polished or cut cross-section of the printed circuit board (100A). When the thickness is not constant, the size relationship may be determined by the average value of the thicknesses measured at five random points.

If desired, a wiring layer electrically connected to the pad metal layers 131 and 132 may be further disposed on the upper and/or lower surfaces of the insulating layer 110. Also, build-up insulating layers may be further disposed on the upper and/or lower surfaces of the insulating layer 110. Also, a build-up wiring layer may be further disposed on the build-up insulating layer, and a build-up via layer penetrating through the build-up insulating layer may be disposed. The number of the build-up insulating layer, the number of the build-up wiring layer, and the number of the build-up via layer are not limited to any particular examples. The above description may be applied to the build-up insulating layer, the build-up wiring layer, and the build-up via layer.

Figure 5:
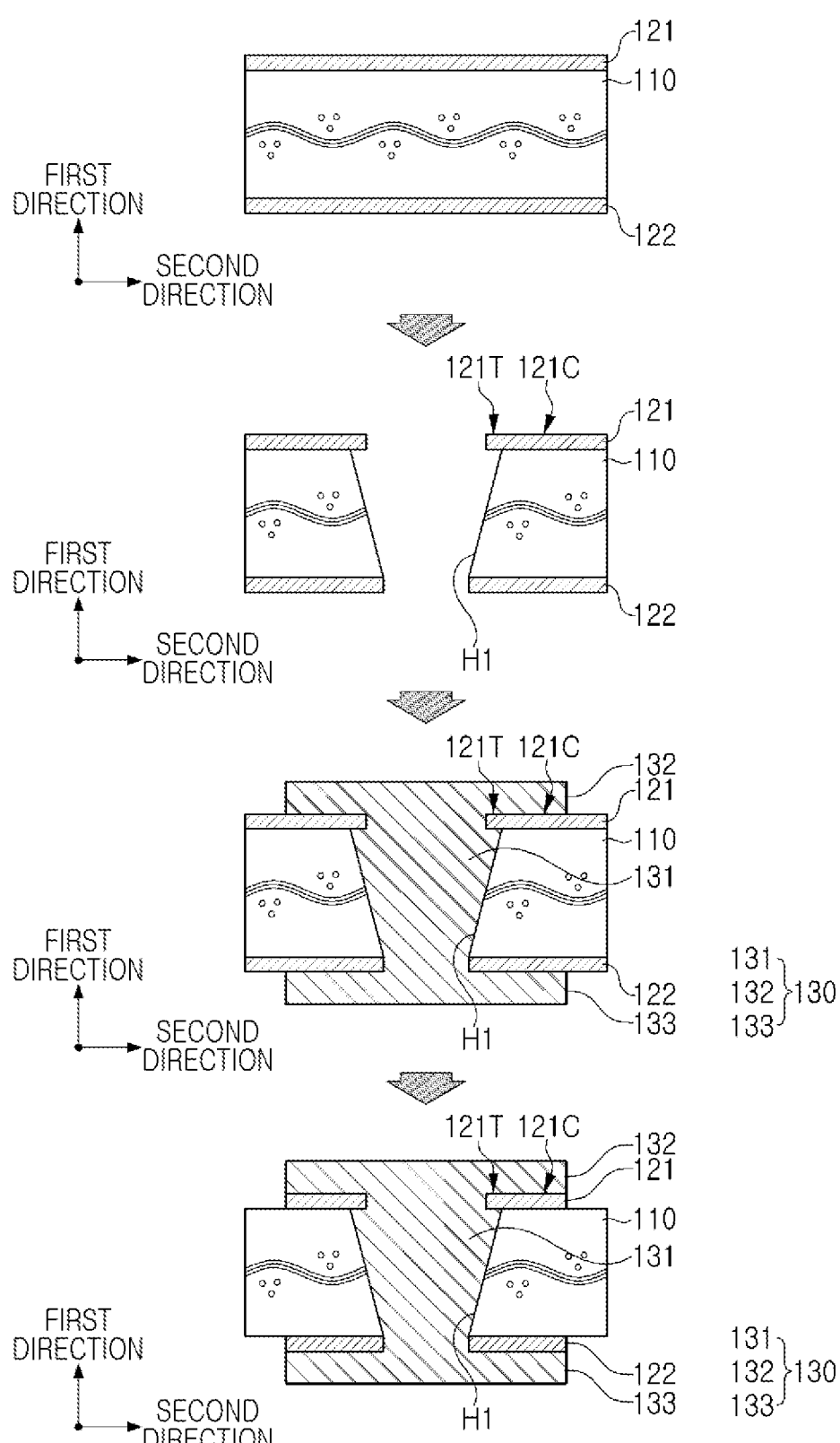
FIG. 5 is a process diagram illustrating an example of manufacturing the printed circuit board in FIG. 3.

FIG. 5 is a process diagram illustrating an example of manufacturing the printed circuit board in FIG. 3.

Referring to the drawing, first, an insulating layer 110 having conductor layers 121 and 122 disposed on both surfaces may be prepared. For example, CCL may be used. Thereafter, processing may be performed in the upper direction of the insulating layer 110 using laser processing, such as, for example, a $CO_2$ drill, thereby forming the via hole H1. In this case, the first non-contact portion 121T may be formed in the first conductor layer 121. Thereafter, the via hole H1 may be filled using a fill-plating process, and plating may be also performed on the conductor layers 121 and 122, thereby forming the metal layer 130. That is, the via metal layer 131 and the pad metal layers 131 and 132 may be formed. In this case, the first non-contact portion 121T of the first conductor layer 121 may work as a wall to stably control the thickness of the fill-plating, thereby addressing dimple defects. Thereafter, by removing the remaining conductor layers 121 and 122 not covered by the pad metal layers 131 and 132 by etching, the above-described printed circuit board 100A may be manufactured.

Figure 6:
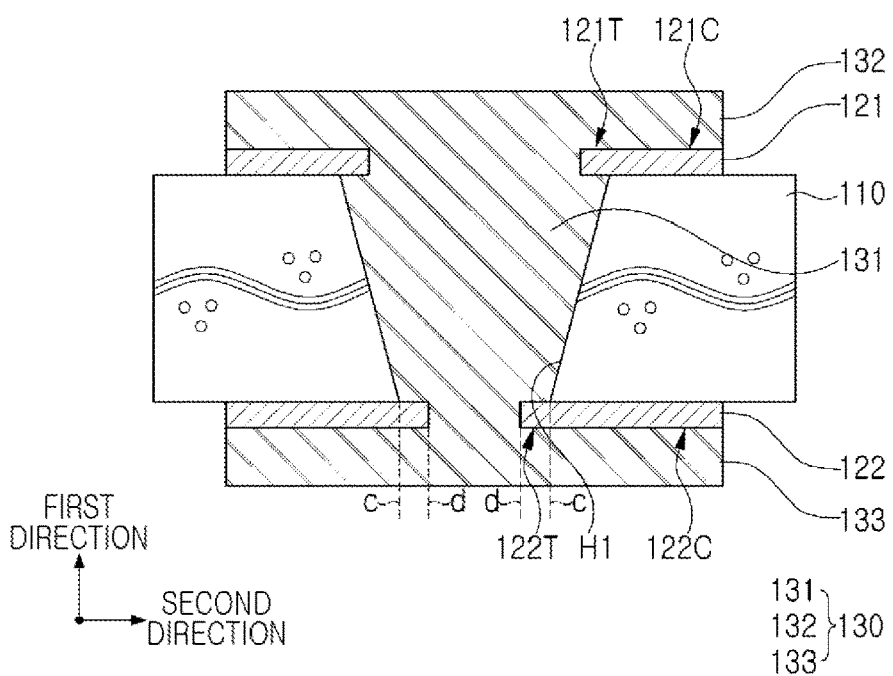
FIG. 6 is a cross-sectional diagram illustrating another example embodiment of a printed circuit board.

FIG. 6 is a cross-sectional diagram illustrating another example embodiment of a printed circuit board.

Figure 7:
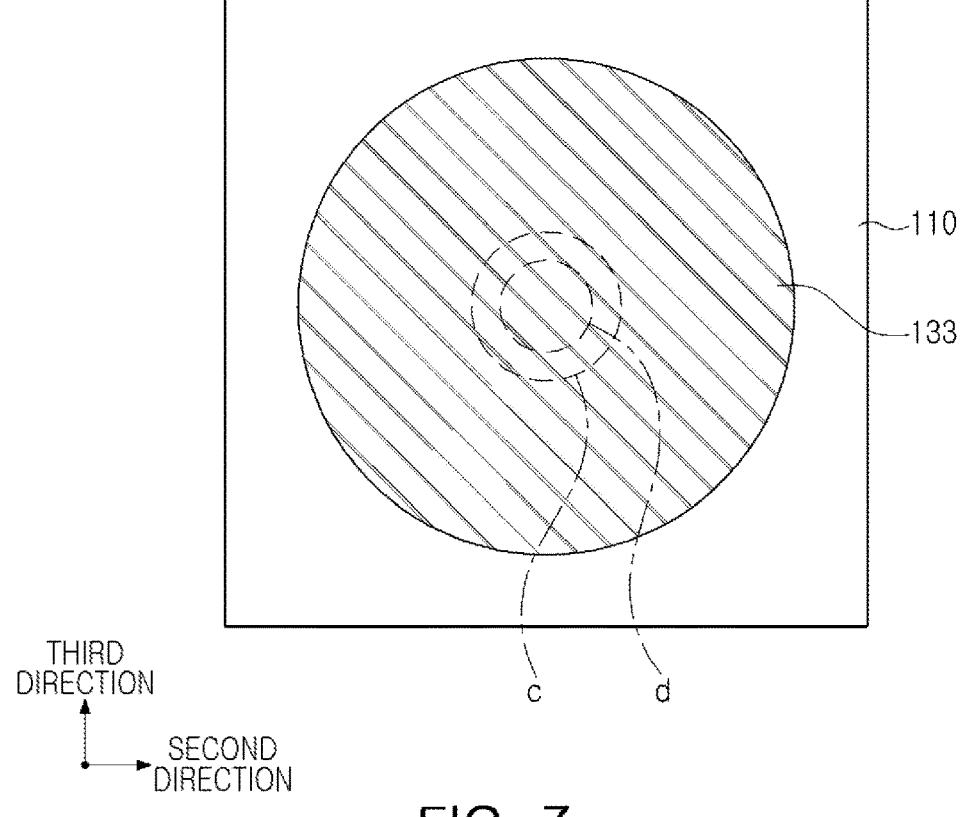
FIG. 7 is a plan diagram illustrating the printed circuit board in FIG. 6, viewed from below.

FIG. 7 is a plan diagram illustrating the printed circuit board in FIG. 6, viewed from below.

Referring to the drawing, in the printed circuit board 100B according to another example embodiment, the second conductor layer 122 may also include a second non-contact portion 122T. For example, the second conductor layer 122 may include a second contact portion 122C in contact with the second surface and a second contact portion 122C protruding from the second contact portion 122C and disposed on the via hole H1 on the side opposite to the first non-contact portion 121T in the first direction with respect to the first direction. Second contact portion 122C and second non-contact portion 122T disposed on the via hole H1 on the opposite side to 121T may be included. That is, the first and second conductor layers 121 and 122 may cover portions of the upper and lower sides of the via hole H1 on opposite sides. In this case, the thickness of the fill-plating may be controlled more stably, such that the above-described effect may be obtained. In the drawing, "c" may be a lower edge of the lower side of the via hole H1, and "d" may be an inner edge of the second conductor layer 122.

The other descriptions are substantially the same as those of the printed circuit board 100A described above, and may thus be substantially equally applied to the printed circuit board 100B according to another example embodiment, and accordingly, overlapping descriptions will not be provided.

A method of manufacturing the printed circuit board 100B according to another example embodiment may be substantially the same as the method of manufacturing the printed circuit board 100A according to the above-described example, and in the process of processing the via hole H1, only the formation of the second non-contact portion 122T of the second conductor layer 122 may be different, and thus, overlapping descriptions will not be provided.

Figure 8:
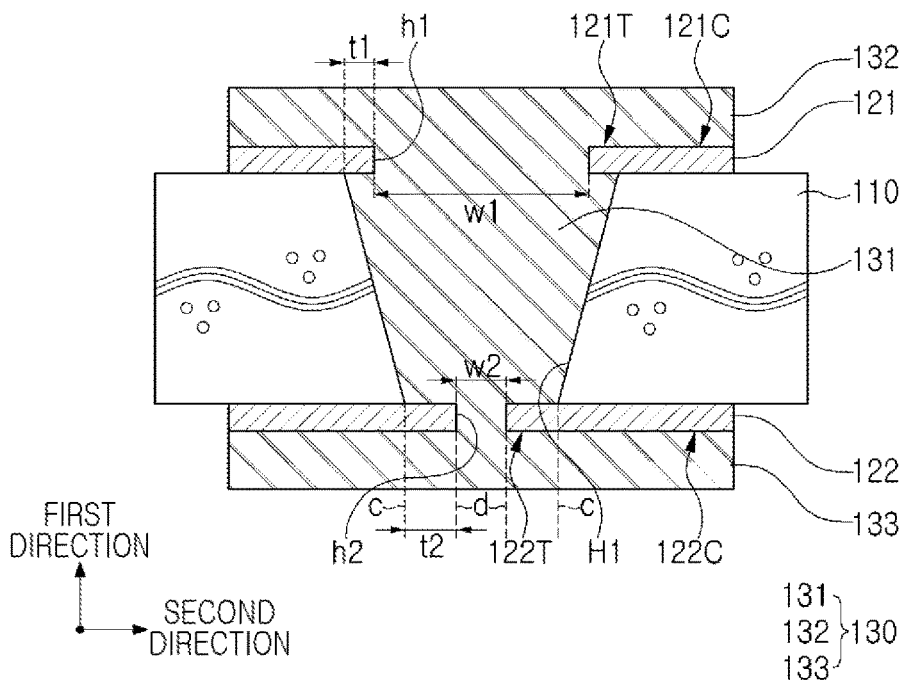
FIG. 8 is a cross-sectional diagram illustrating another example embodiment of a printed circuit board.

FIG. 8 is a cross-sectional diagram illustrating another example embodiment of a printed circuit board.

Figure 9:
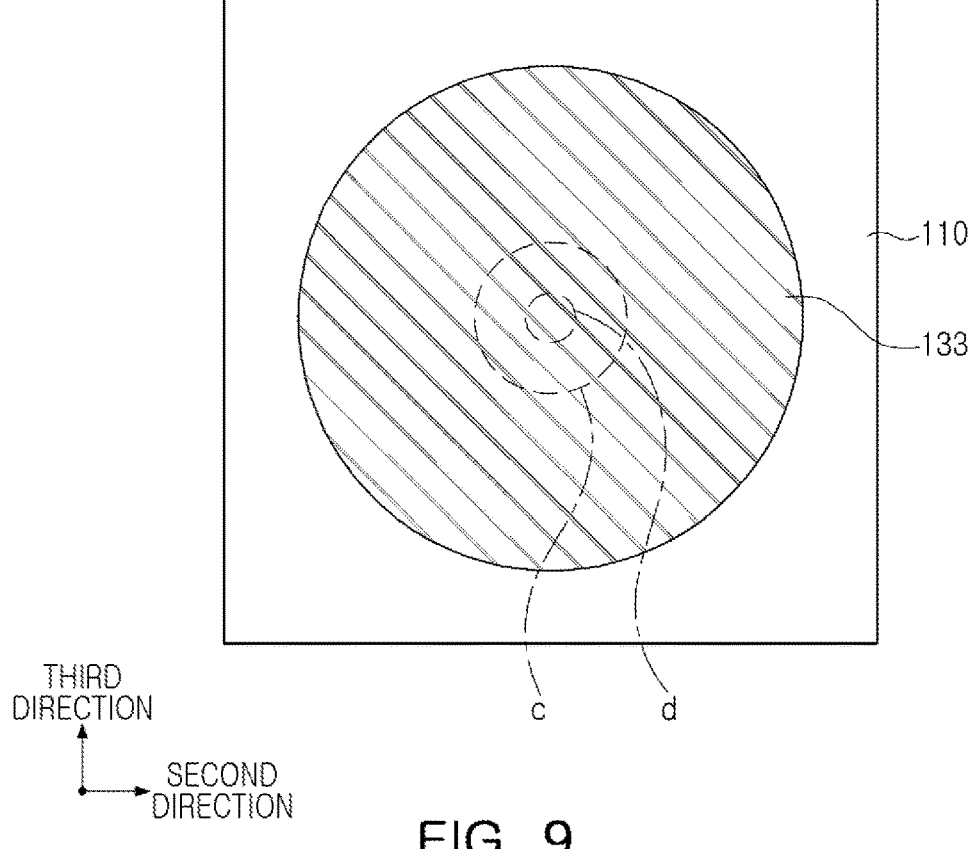
FIG. 9 is a plan diagram illustrating the printed circuit board in FIG. 8, viewed from below.

FIG. 9 is a plan diagram illustrating the printed circuit board in FIG. 8, viewed from below.

Referring to the drawings, in the printed circuit board 100C according to another example embodiment, the second conductor layer 122 may have a second non-contact portion 122T similarly to the printed circuit board 100B according to another example embodiment, and the protruding lengths t1 and t2 of the first and second non-contact portions 121T and 122T may be different. For example, with respect to the second direction, the protruding length t1 of the first non-contact portion 121T may be different from the protruding length t2 of the second non-contact portion 122T. Accordingly, the first and second conductor layers 121 and 122 may have first and second openings h1 and h2 on the via hole H1, respectively, and in this case, the first and second openings h1 and h2 may have different widths w1 and w2. For example, the protruding length t2 of the second non-contact portion 122T may be relatively larger, and the width w2 of the second opening h2 may be relatively smaller. Meanwhile, in the drawing, "c" may be a lower edge of the via hole H1, and "d" may be an inner edge of the second conductor layer 122.

Here, the length and width may be measured using a scanning microscope or an optical microscope, such as an optical microscope of Olympus (×1,000), based on the polished or cut cross-section of the printed circuit board 100C. When the length or width is not constant, the size relationship may be determined by the average value of the length or width measured at five random points.

The other descriptions are substantially the same as those of the printed circuit boards 100A and 100B described above, and may thus be substantially equally applied to the printed circuit board 100C according to another example embodiment, and accordingly, overlapping descriptions will not be provided.

A method of manufacturing the printed circuit board 100C according to another example embodiment may be substantially the same as the method of manufacturing the printed circuit board 100A according to the above-described example, and in the process of processing the via hole H1, only the formation of the second non-contact portion 122T of the second conductor layer 122 may be different, and thus, overlapping descriptions may not be provided.

Figure 10:
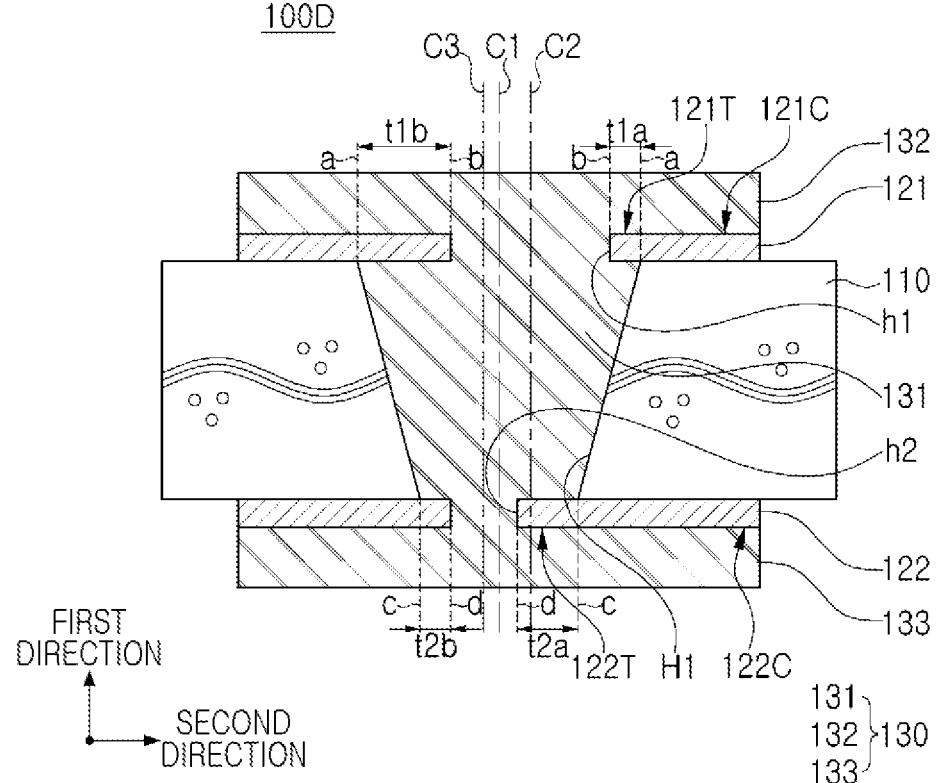
FIG. 10 is a cross-sectional diagram illustrating another example embodiment of a printed circuit board.

FIG. 10 is a cross-sectional diagram illustrating another example embodiment of a printed circuit board.

Figure 11A:
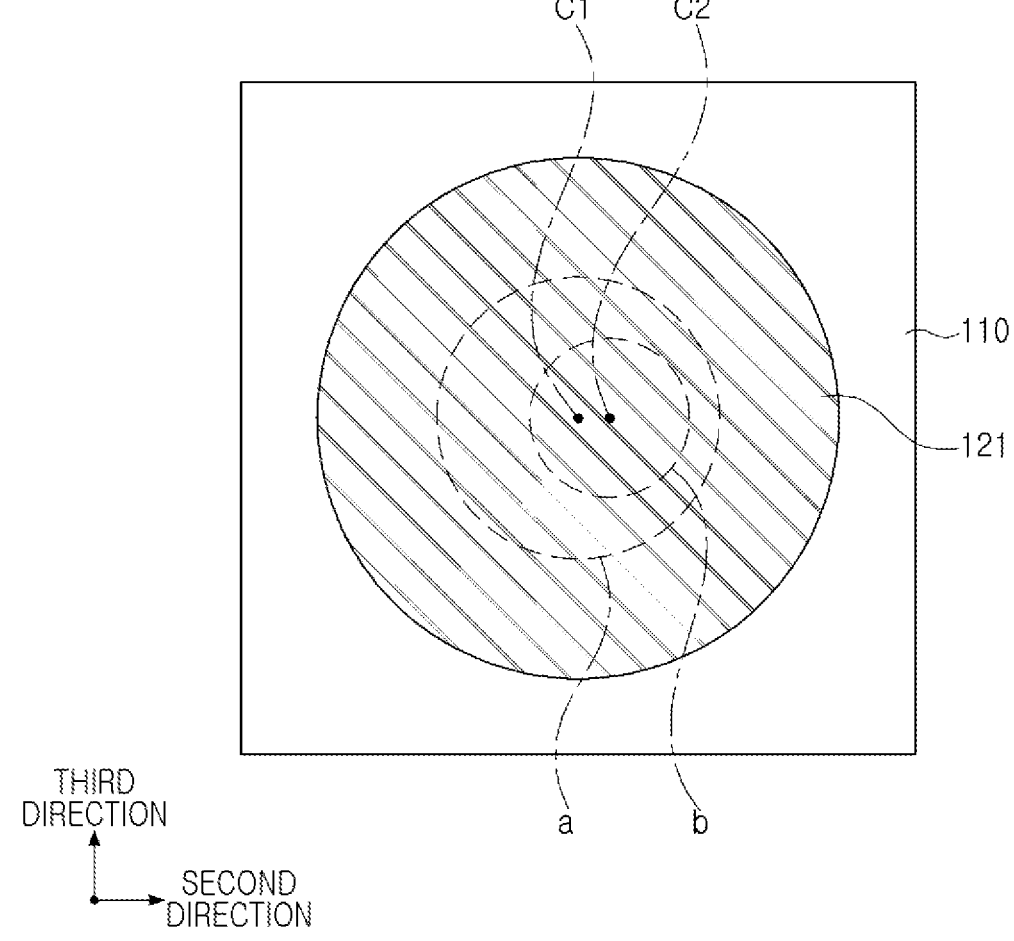
FIGS. 11A and 11B are plan diagrams illustrating the printed circuit board in FIG. 10, viewed from above and below, respectively.
Figure 11B:
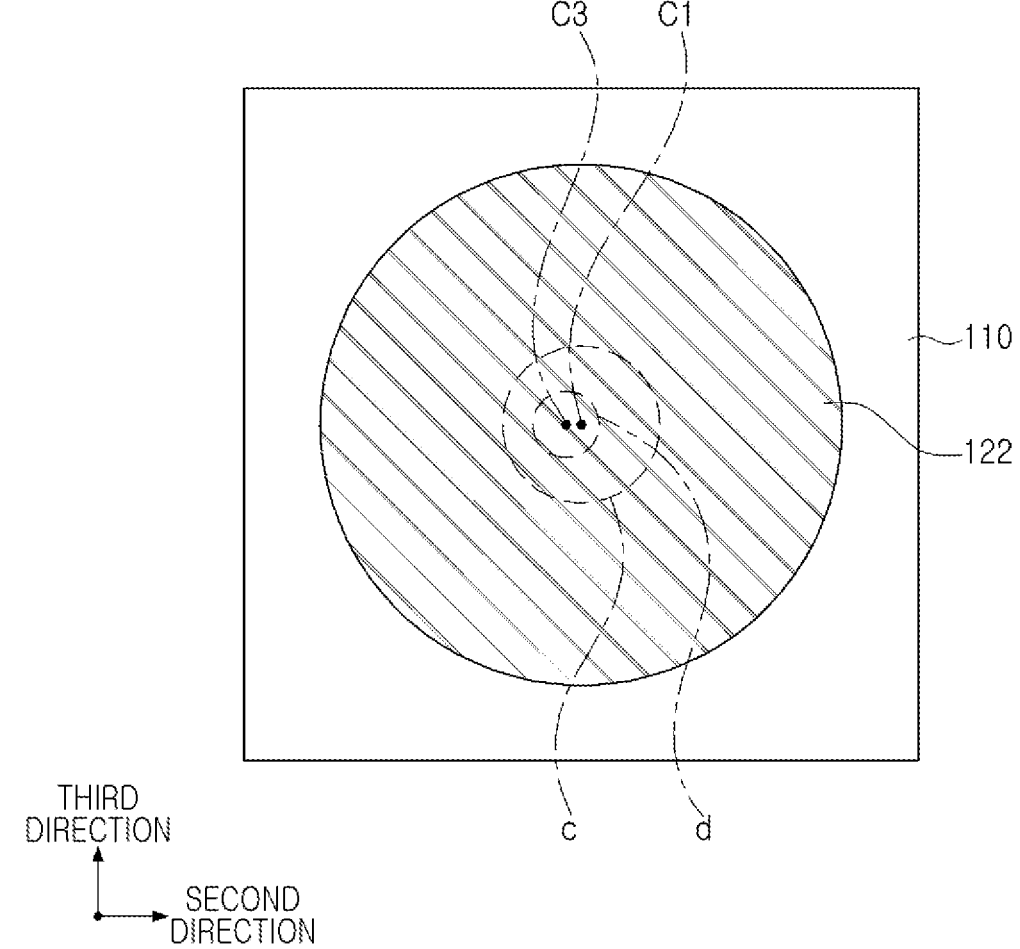

FIGS. 11A and 11B are plan diagrams illustrating the printed circuit board in FIG. 10, viewed from above and below, respectively.

Referring to the drawings, in the printed circuit board 100D according to another example embodiment, the second conductor layer 122 may have a second non-contact portion 122T similarly to the printed circuit board 100B according to another example embodiment, and the first and second conductor layers 121 and 122 may have first and second openings h1 and h2 on the via hole H1, respectively, and the central lines C2 and C3 of the first and second openings h1 and h2 may be shifted from the central line C1 of the via hole H1 with respect to the second direction on a cross-section. That is, each of the first and second conductor layers 121 and 122 may be shifted with respect to the second direction. For example, in the first conductor layer 121, the protruding lengths t1*a* and t1*b* of the first non-contact portion 121T may not be constant, and in the second conductor layer 122, the protruding lengths of the second non-contact portion 122T may not be constant. The protruding lengths t2*a* and t2*b* may not be constant. In the drawings, "a" may be an upper edge of the via hole H1, and "b" may be an inner edge of the first conductor layer 121. Also, "c" may be a lower edge of the via hole H1, and "d" may be an inner edge of the second conductor layer 122.

Here, the length may be measured using a scanning microscope or an optical microscope, such as an optical microscope of Olympus (×1,000), based on the polished or cut cross-section of the printed circuit board 100D. When the length is not constant, it may be observed and determined by naked eye, and when the difference is minute, the length may be determined by measuring the lengths at five random points.

The other descriptions are substantially the same as those of the printed circuit boards 100A and 100B described above, and may thus be substantially equally applied to the printed circuit board 100D according to another example embodiment, and accordingly, overlapping descriptions will not be provided.

A method of manufacturing the printed circuit board 100D according to another example embodiment may be substantially the same as the method of manufacturing the printed circuit board 100A according to the above-described example, and in the process of processing the via hole H1, only in the formation of the non-contact portions 121T and 122T of the conductor layer 121 and 122 may be different, and overlapping descriptions may not be provided.

Figure 12:
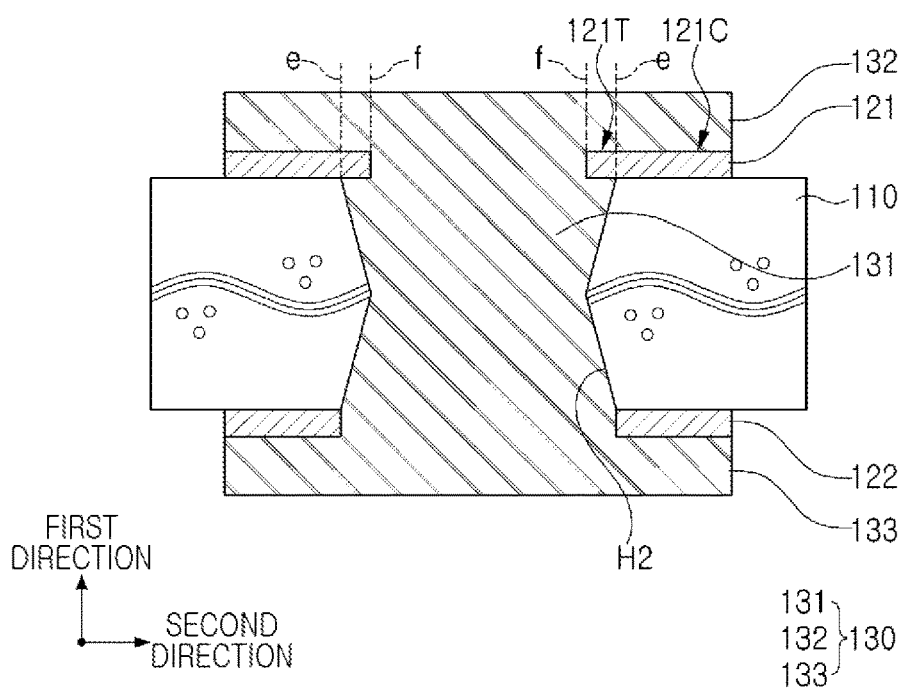
FIG. 12 is a cross-sectional diagram illustrating another example embodiment of a printed circuit board.

FIG. 12 is a cross-sectional diagram illustrating another example embodiment of a printed circuit board.

Figure 13:
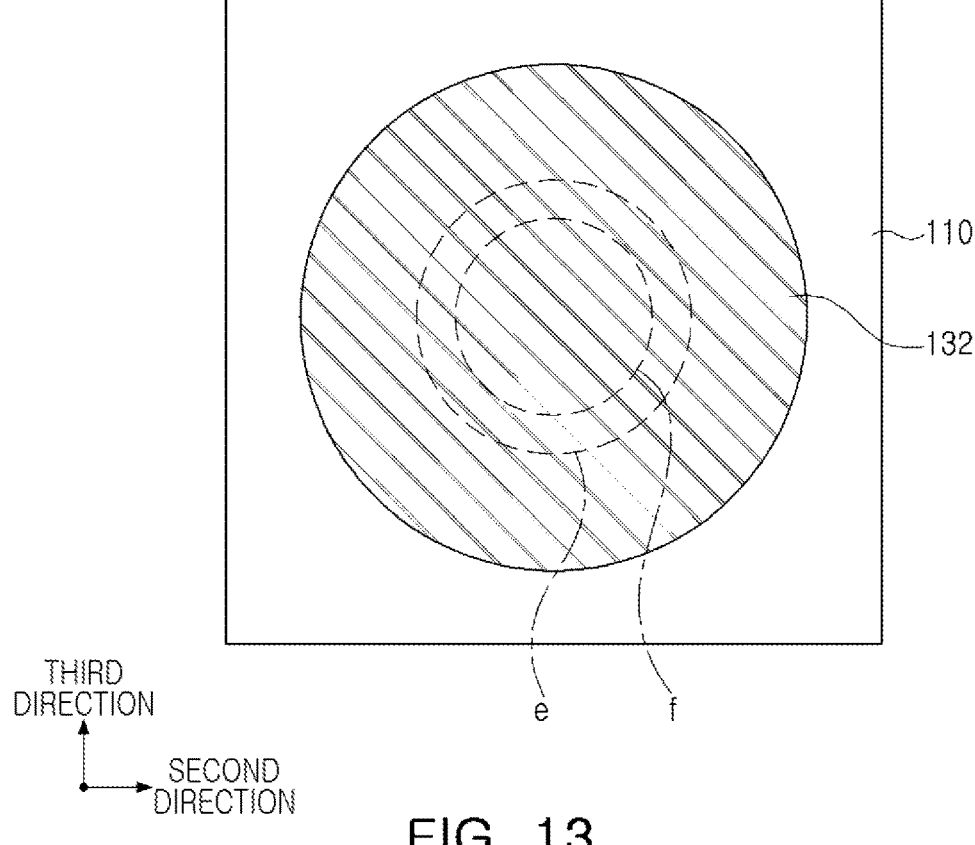
FIG. 13 is a plan diagram illustrating the printed circuit board in FIG. 12, viewed from top.

FIG. 13 is a plan diagram illustrating the printed circuit board in FIG. 12, viewed from top.

Referring to the drawings, in the printed circuit board 100E according to another example embodiment, the shape of the via hole H2 may be different from the example in the printed circuit board 100A according to the above-described example. Specifically, on a cross-section, the via hole H2 may have a shape in which a width on the upper surface of the insulating layer 110 and a width on the lower surface of the insulating layer 110 may be greater than a width on an inner side of the insulating layer 110 between the surfaces, that is, for example, in the center. For example, the via hole H2 may have an hourglass shape. At least a portion of each of the inorganic filler and/or glass fibers included in the insulating layer 110 may protrude from a wall surface of the via hole H2. In the drawings, "e" may be an upper edge of the via hole H2, and "f" may be an inner edge of the first conductor layer 121.

Here, the width may be measured using a scanning microscope or an optical microscope, such as an optical microscope of Olympus (×1,000) based on the polished or cut cross-section of the printed circuit board 100E, and when the width is not constant, the size relationship may be determined based on the largest width.

The other descriptions are substantially the same as those of the printed circuit board 100A described above, and may thus be substantially equally applied to the printed circuit board 100E according to another example embodiment, and accordingly, overlapping descriptions will not be provided.

Figure 14:
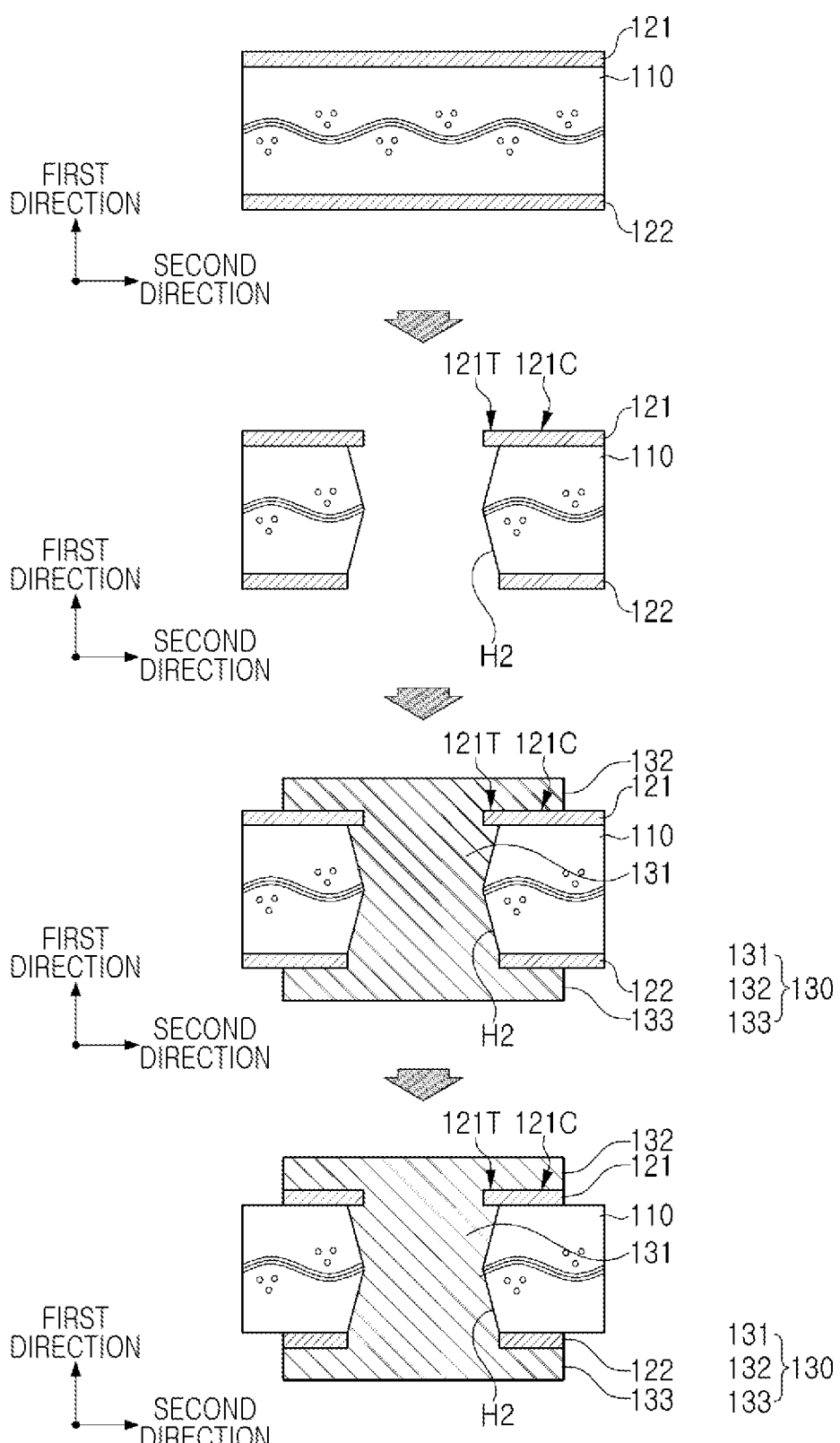
FIG. 14 is a process diagram illustrating an example of manufacturing the printed circuit board in FIG. 12.

FIG. 14 is a process diagram illustrating an example of manufacturing the printed circuit board in FIG. 12.

Referring to the drawings, in the example of manufacturing the printed circuit board 100E according to another example embodiment, the processing of the via hole H2 may be different from the example in the manufacturing the printed circuit board 100A according to the above-described example. For example, the via hole H2 may be formed by performing processing in both the upper and lower directions of the insulating layer 110 using laser processing, such as, for example, a $CO_2$ drill.

The other descriptions are substantially the same as those of the printed circuit board 100A described above, and may thus be substantially equally applied to the printed circuit board 100E according to another example embodiment, and accordingly, overlapping descriptions will not be provided.

Figure 15:
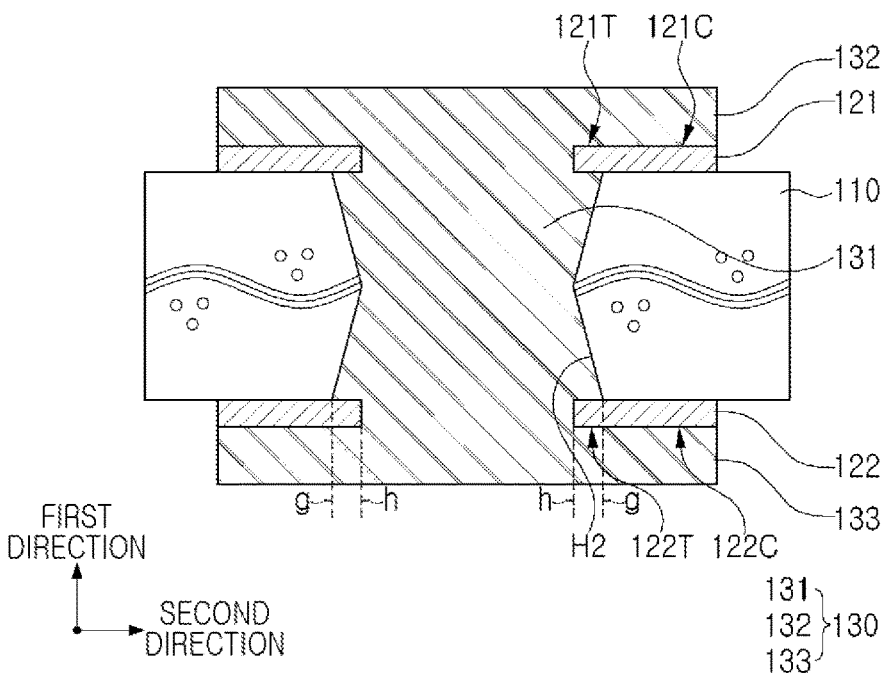
FIG. 15 is a cross-sectional diagram illustrating another example embodiment of a printed circuit board.

FIG. 15 is a cross-sectional diagram illustrating another example embodiment of a printed circuit board.

Figure 16:
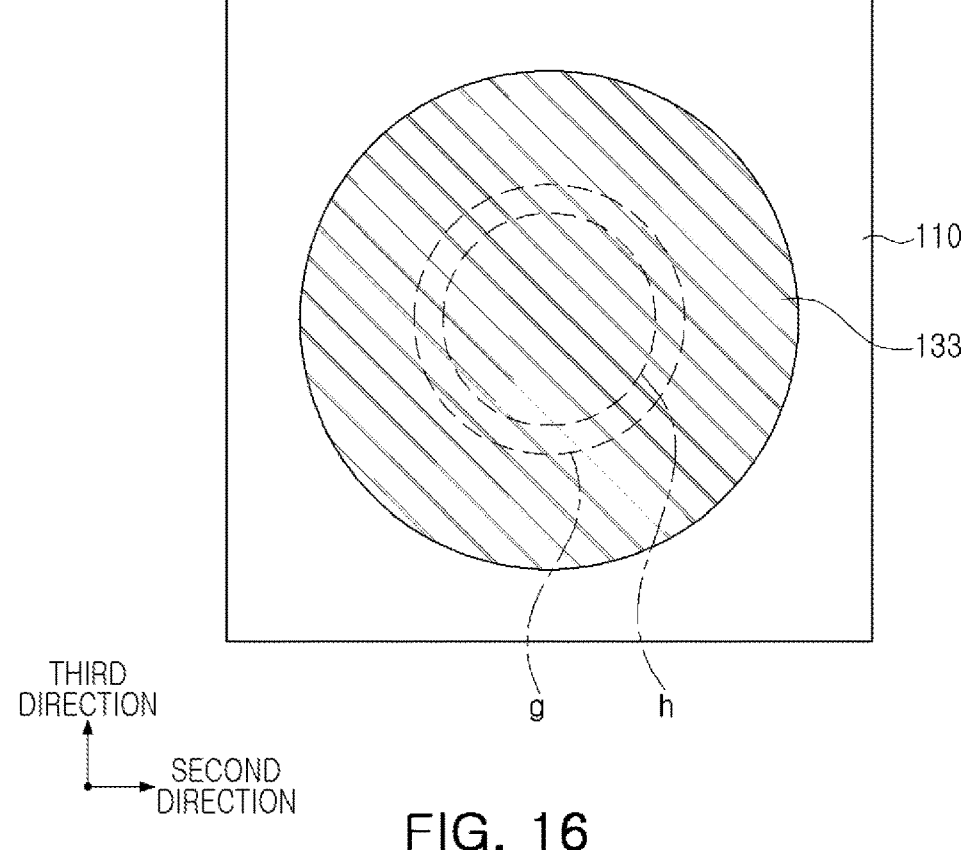
FIG. 16 is a plan diagram illustrating the printed circuit board in FIG. 15, viewed from below.

FIG. 16 is a plan diagram illustrating the printed circuit board in FIG. 15, viewed from below.

Referring to the drawings, in the printed circuit board 100F according to another example embodiment, the second conductor layer 122 may also have a second non-contact portion 122T. For example, the second conductor layer 122 may include a second contact portion 122C in contact with the second surface, and a second non-contact portion 122T protruding from the second contact portion 122C in the second direction and disposed on the via hole H2 on the side opposite to the first contact portion 121C and the first no-contact portion 121T with respect to the first direction. That is, the first and second conductor layers 121 and 122 may cover portions of the upper and lower portions of the via hole H2 on opposite sides. In this case, the thickness of the fill-plating may be controlled more stably, such that the above-described effect may be obtained. In the drawings, "g" may be a lower edge of the via hole H2, and "h" may be an inner edge of the second conductor layer 122.

The other descriptions are substantially the same as those of the printed circuit boards 100A and 100E described above, and may thus be substantially equally applied to the printed circuit board 100F according to another example embodiment, and accordingly, overlapping descriptions will not be provided.

A method of manufacturing the printed circuit board 100F according to another example embodiment may be substantially the same as the method of manufacturing the printed circuit board 100E according to another example embodiment described above, and in the process of processing the via hole H2, the second conductor Since only the formation of the second non-contact portion 122T of the layer 122 may be different, overlapping descriptions may not be provided.

Figure 17:
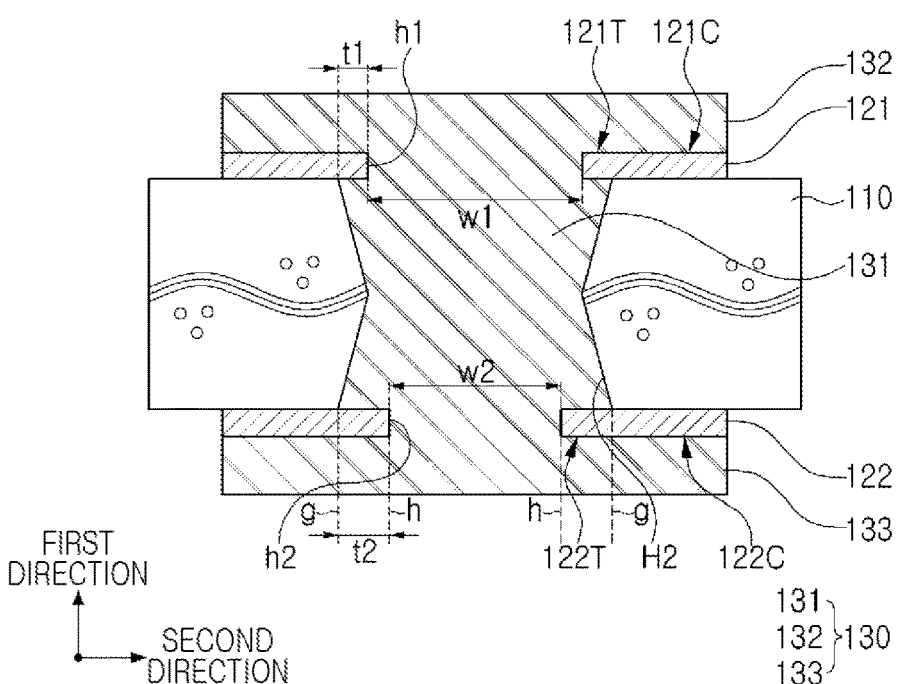
FIG. 17 is a cross-sectional diagram illustrating another example embodiment of a printed circuit board.

FIG. 17 is a cross-sectional diagram illustrating another example embodiment of a printed circuit board.

Figure 18:
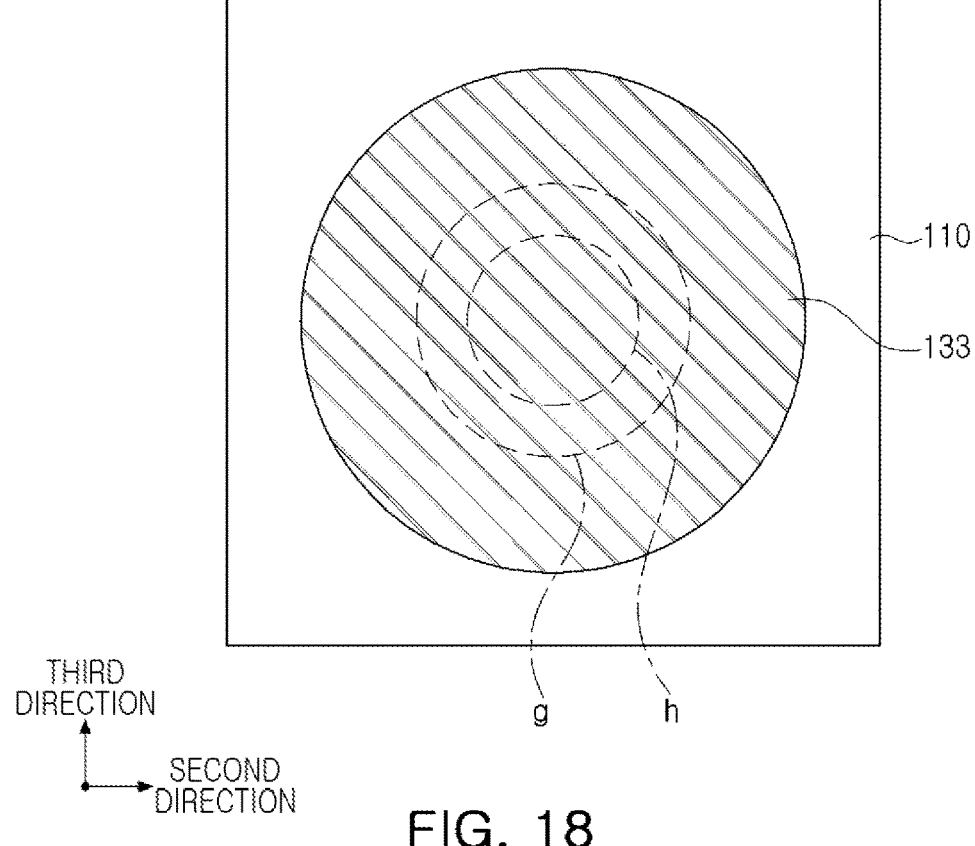
FIG. 18 is a plan diagram illustrating the printed circuit board in FIG. 15, viewed from below.

FIG. 18 is a plan diagram illustrating the printed circuit board in FIG. 15, viewed from below.

Referring to the drawings, in the printed circuit board 100G according to another example embodiment, the second conductor layer 122 may have a second non-contact portion 122T similarly to the printed circuit board 100F according to another example embodiment, and the protruding lengths t1 and t2 of the first and second non-contact portions 121T and 122T may be different. For example, with respect to the second direction, the protruding length t1 of the first non-contact portion 121T may be different from the protruding length t2 of the second non-contact portion 122T. Accordingly, the first and second conductor layers 121 and 122 may have first and second openings h1 and h2 on the via hole H2, respectively. In this case, the first and second openings h1 and h2 may have different widths w1 and w2. For example, the protruding length t2 of the second non-contact portion 122T may be relatively larger, and the width w2 of the second opening h2 may be relatively smaller, but an example embodiment thereof is not limited thereto. Meanwhile, in the drawings, "g" may be a lower edge of the via hole H2, and "h" may be an inner edge of the second conductor layer 122.

Here, the length and width may be measured using a scanning microscope or an optical microscope, such as, for example, an optical microscope of Olympus (×1,000), based on the polished or cut cross-section of the printed circuit board (100G). When the length or width is not constant, the size relationship may be determined by the average value of the lengths or widths measured at five random points.

The other descriptions are substantially the same as those of the printed circuit boards 100A, 100E, and 100F described above, and may thus be substantially equally applied to the printed circuit board 100G according to another example embodiment, and accordingly, overlapping descriptions will not be provided.

A method of manufacturing the printed circuit board 100G according to another example embodiment may be substantially the same as the method of manufacturing the printed circuit board 100E according to another example embodiment described above, and in the process of processing the via hole H2, only the formation of the second non-contact portion 122T of the second conductor layer 122 may be different, and thus, overlapping descriptions may not be provided.

Figure 19:
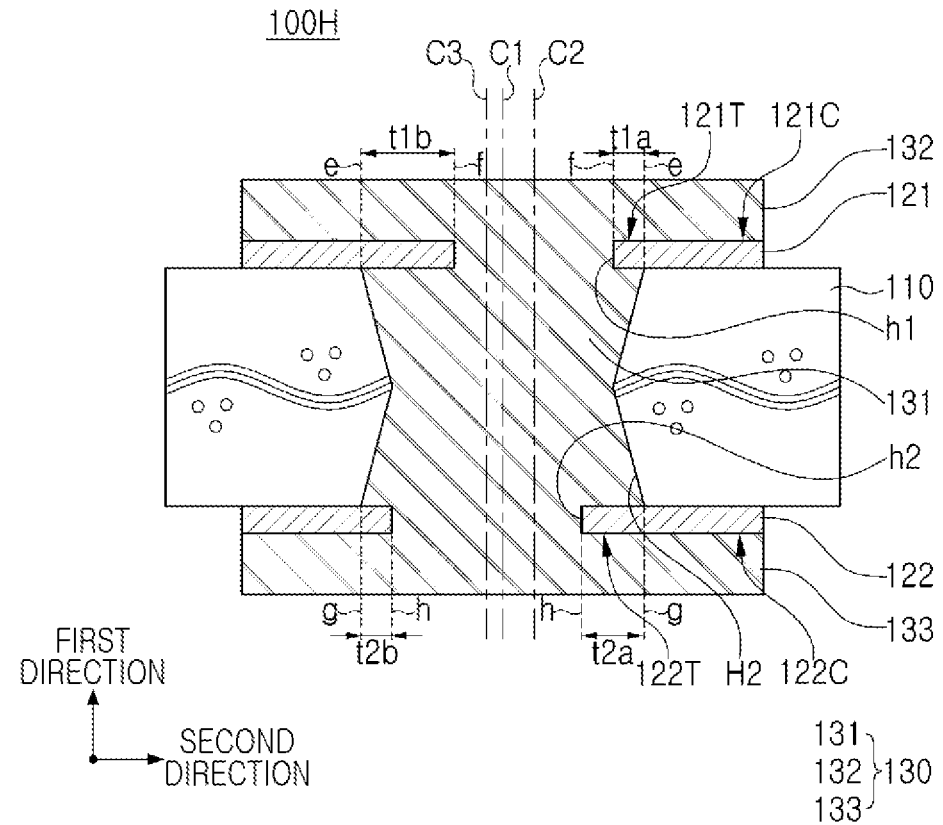
FIG. 19 is a cross-sectional diagram illustrating another example embodiment of a printed circuit board.

FIG. 19 is a cross-sectional diagram illustrating another example embodiment of a printed circuit board.

Figure 20A:
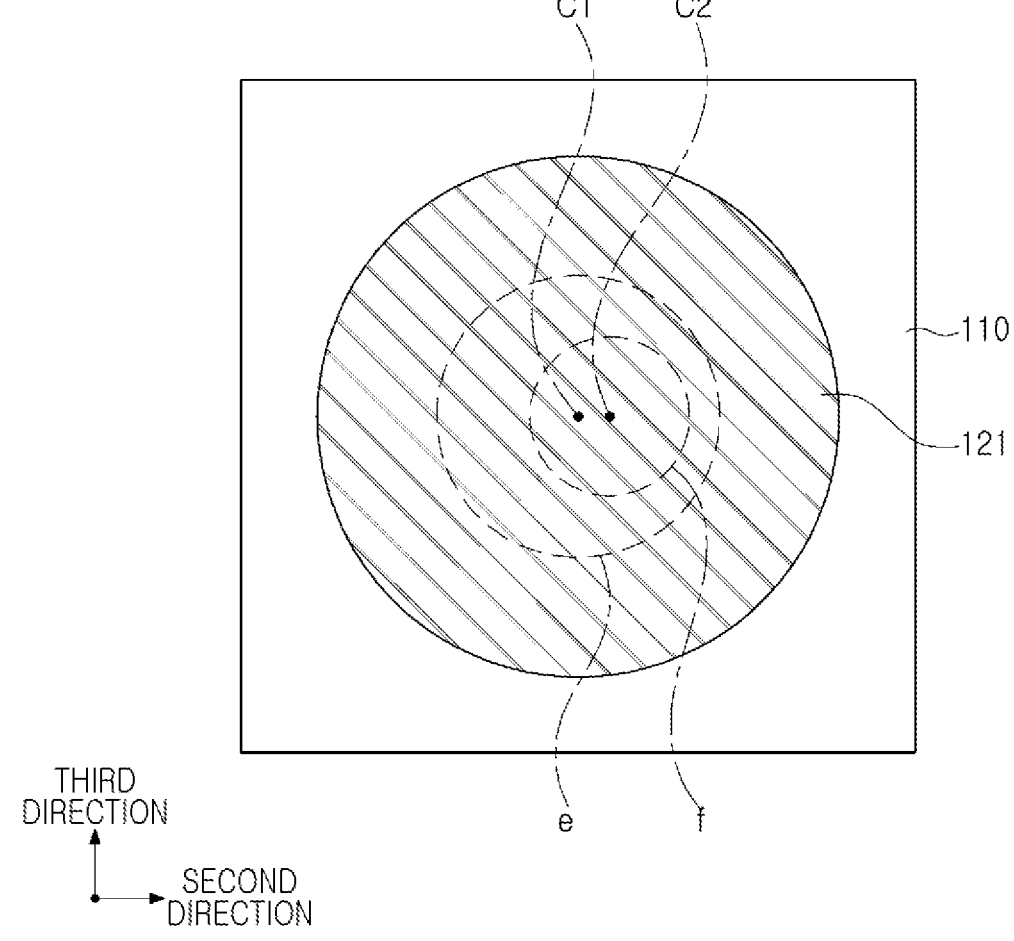
FIGS. 20A and 20B are plan diagrams illustrating the printed circuit board in FIG. 19, viewed from above and below, respectively.
Figure 20B:
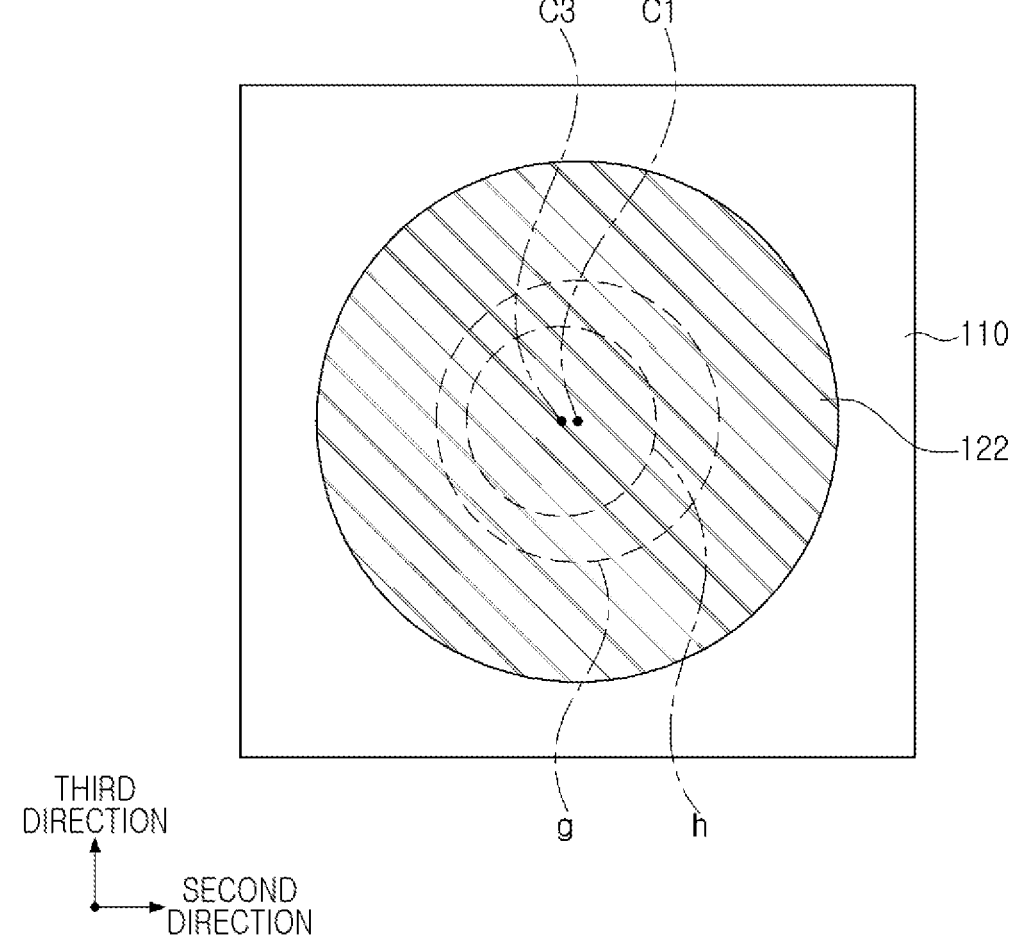

FIGS. 20A and 20B are plan diagrams illustrating the printed circuit board in FIG. 19, viewed from above and below, respectively.

Referring to the drawings, in the printed circuit board 100H according to another example embodiment, the second conductor layer 122 may have a second non-contact portion 122T similarly to the printed circuit board 100F according to another example embodiment, the first and second conductor layers 121 and 122 may have first and second openings h1 and h2 on the via hole H2, respectively, and on a cross-section, the central lines c2 and c3 of the first and second openings h1 and h2 may be shifted from the central line c1 of the via hole H2 with respect to the second direction. That is, each of the first and second conductor layers 121 and 122 may be shifted with respect to the second direction. For example, in the first conductor layer 121, the protruding lengths t1a and t1b of the first non-contact portion 121T may not be constant, and in the second conductor layer 122, the protruding lengths t2a and t2b of the second non-contact portion 122T may not be constant. In the drawings, "e" may be an upper edge of the via hole H2, and "f" may be an inner edge of the first conductor layer 121. Also, "g" may be a lower edge of the via hole H2, and "h" may be an inner edge of the second conductor layer 122.

Here, the length may be measured using a scanning microscope or an optical microscope, such as an optical microscope of Olympus (×1,000), based on the polished or cut cross-section of the printed circuit board 100H. When the length is not constant, the length may be observed and determined by naked eye, and when the difference is minute, the length may be determined by measuring the lengths at five random points.

The other descriptions are substantially the same as those of the printed circuit boards 100A, 100E, and 100F described above, and may thus be substantially equally applied to the printed circuit board 100H according to another example embodiment, and accordingly, overlapping descriptions will not be provided.

A method of manufacturing the printed circuit board 100H according to another example embodiment may be substantially the same as the method of manufacturing the printed circuit board 100E according to the other example described above, and in the process of processing the via hole H2, only the formation of the non-contact portions 121T and 122T of the conductor layers 121 and 122 may be different, and thus, overlapping descriptions may not be provided.

According to the aforementioned example embodiments, a printed circuit board which may improve fill-plating quality in via holes, such as, for example, addressing dimple defects.

In the example embodiments, the cross-section may refer to a cross-sectional shape when an object is vertically cut, or a cross-sectional shape when the object is viewed from the side. Also, a plane may refer to a planar shape when the object is horizontally cut, or a planar shape when the object is viewed from the top or the bottom.

In the present disclosure, the example embodiments may include process errors, positional deviations, and measurement errors occurring in the process. For example, the configuration in which components are substantially the same may include the example in which the components are completely the same, and also the example in which a slight difference due to a process error may be present. Also, the configuration in which elements are substantially constant may include the example in which the elements are completely constant, and also the example in which a minute difference may be generated due to a process error.

In the example embodiments, the term "connected" may not only refer to "directly connected" but also include "indirectly connected" by may refer to of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, and may be provided to describe and emphasize different unique features of each example embodiment. The above suggested example embodiments may be implemented do not exclude the possibilities of combination with features of other example embodiments. For example, even though the features described in an example embodiment are not described in the other example embodiment, the description may be understood as relevant to the other example embodiment unless otherwise indicated.

An expression used in the singular encompasses the expression of the plural, unless it has a clearly different meaning in the context.

While the example embodiments have been illustrated and described above, it will be apparent to those skilled in the art that modifications and variations could be made without departing from the scope of the present invention as defined by the appended claims.

What is claimed is:

1. A printed circuit board, comprising:
an insulating layer having first and second surfaces facing each other along a first direction;
a via hole penetrating a region between the first and second surfaces so as to extend from the first surface to reach the second surface of the insulating layer;
a first conductor layer including:
a first contact portion in contact with the first surface; and
a first non-contact portion disposed on the via hole and protruding from the first contact portion along a second direction perpendicular to the first direction;
a metal layer filling the via hole; and
a second conductor layer including a second contact portion in contact with the second surface,
wherein the first non-contact portion includes a lower surface in contact with a portion of the metal layer above the second surface in the first direction, and
the second conductor layer further includes a second non-contact portion protruding from the second contact portion along the second direction and disposed on the via hole on a side facing the first non-contact portion along the first direction.

2. The printed circuit board of claim 1, wherein the metal layer extends to the first and second conductor layers.

3. The printed circuit board of claim 1, wherein, along the second direction, a protruding length of the first non-contact portion is different from a protruding length of the second non-contact portion.

4. The printed circuit board of claim 1, wherein the first and second conductor layers have first and second openings on the via hole, respectively.

5. The printed circuit board of claim 4, wherein a width of each of the first and second openings is different from each other on a cross-section of the printed circuit board.

6. The printed circuit board of claim 4, wherein, along the second direction, a central line of each of the first and second openings is shifted from a central line of the via hole on a cross-section of the printed circuit board.

7. The printed circuit board of claim 1, wherein the via hole has a shape in which a width thereof aligned with the first surface is greater than a width of the via hole aligned with the second surface on a cross-section of the printed circuit board.

8. The printed circuit board of claim 1, wherein the via hole has a shape in which a width thereof aligned with each of the first and second surfaces is greater than a width of the via hole on an internal side between the first and second surfaces on a cross-section of the printed circuit board.

9. A printed circuit board, comprising:

an insulating layer;

a via metal layer penetrating a region between upper and lower surfaces of the insulating layer so as to extend from the upper surface to reach the lower surface of the insulating layer;

a first conductor layer disposed on an upper surface of the insulating layer and extending partially upwardly of the via metal layer to cover a portion of an upper side of the via metal layer; and a second conductor layer disposed on a lower surface of the insulating layer and partially extending downwardly of the via metal layer to cover a portion of a lower side of the via metal layer, wherein the first conductor layer includes a lower surface in contact with a portion of the via metal layer above the lower surface of the insulating layer to define an interface between the lower surface of the first conductor layer and the portion of the via metal layer, and at least a portion of the lower side of the via metal layer does not contact the second conductor layer.

10. The printed circuit board of claim 9, further comprising:

a first pad metal layer disposed on an upper surface of the first conductor layer and connected to an upper surface of the via metal layer; and a second pad metal layer disposed on a lower surface of the second conductor layer and connected to a lower side of the via metal layer.

11. The printed circuit board of claim 9, wherein the insulating layer includes an insulating resin, an inorganic filler, and glass fiber.

12. The printed circuit board of claim 9, wherein the first and second conductor layers include copper foil.

13. The printed circuit board of claim 9, wherein the via metal layer includes a copper (Cu) plating layer.

14. A printed circuit board, comprising:

an insulating layer having first and second surfaces facing each other along a first direction;

a via hole penetrating a region between the first and second surfaces so as to extend from the first surface to reach the second surface of the insulating layer;

a first conductor layer including:

a first contact portion in contact with the first surface; and a first non-contact portion disposed on the via hole and protruding from the first contact portion along a second direction perpendicular to the first direction;

a second conductor layer including a second contact portion in contact with the second surface; and a metal layer filling the via hole, wherein the first and second conductor layers have first and second openings on the via hole, respectively, and a width of each of the first and second openings is different from each other on a cross-section of the printed circuit board, and wherein the first non-contact portion includes a lower surface in contact with a portion of the metal layer above the second surface in the first direction.

15. The printed circuit board of claim 14, wherein the metal layer extends to the first and second conductor layers.

16. The printed circuit board of claim 14, wherein the second conductor layer further includes a second non-contact portion disposed on the via hole and protruding from second first contact portion along a second direction perpendicular to the first direction.

17. The printed circuit board of claim 16, wherein, along the second direction, a protruding length of the first non-contact portion is different from a protruding length of the second non-contact portion.

18. The printed circuit board of claim 14, wherein, along the second direction, a central line of each of the first and second openings is shifted from a central line of the via hole on the cross-section of the printed circuit board.

19. The printed circuit board of claim 14, wherein the via hole has a shape in which a width thereof aligned with the first surface is greater than a width of the via hole aligned with the second surface on the cross-section of the printed circuit board.

20. The printed circuit board of claim 14, wherein the via hole has a shape in which a width thereof aligned with each of the first and second surfaces is greater than a width on an internal side between the first and second surfaces on the cross-section of the printed circuit board.

* * * * *